United States Patent
Koyama (10) Patent No.: US 8,350,351 B2
(45) Date of Patent: Jan. 8, 2013

(54) SEMICONDUCTOR LIGHT RECEIVING DEVICE

(75) Inventor: Yuji Koyama, Kanagawa (JP)

(73) Assignee: Sumitomo Electric Device Innovations, Inc., Yokohama-shi, Kanagawa (JP)

( * ) Notice: Subject to any disclaimer, the term of this patent is extended or adjusted under 35 U.S.C. 154(b) by 297 days.

(21) Appl. No.: 12/893,750

(22) Filed: Sep. 29, 2010

(65) Prior Publication Data

US 2011/0089515 A1    Apr. 21, 2011

(30) Foreign Application Priority Data

Oct. 21, 2009   (JP) .................................. 2009-242175

(51) Int. Cl.
*H01L 31/0224* (2006.01)
*H01L 31/0352* (2006.01)

(52) U.S. Cl. . 257/448; 257/459; 257/466; 257/E31.124; 257/E31.054

(58) Field of Classification Search .................. 257/431, 257/443, 448, 459, 466, E31.124, E31.054
See application file for complete search history.

(56) References Cited

U.S. PATENT DOCUMENTS

| | | | | |
|---|---|---|---|---|
| 5,426,304 A | * | 6/1995 | Belcher et al. ................. | 250/332 |
| 5,485,010 A | * | 1/1996 | Owen et al. .................... | 250/332 |
| 5,547,282 A | * | 8/1996 | Pinhack et al. ................. | 374/36 |
| 5,559,332 A | * | 9/1996 | Meissner et al. ............ | 250/338.2 |
| 5,572,029 A | * | 11/1996 | Walker et al. ............... | 250/338.3 |
| 5,578,826 A | * | 11/1996 | Walker et al. ............... | 250/338.3 |
| 5,626,773 A | * | 5/1997 | Belcher et al. .................. | 216/47 |
| 5,644,838 A | * | 7/1997 | Beratan .......................... | 29/840 |
| 5,743,006 A | * | 4/1998 | Beratan .......................... | 29/840 |
| 6,348,739 B1 | * | 2/2002 | Taguchi et al. ............... | 257/778 |
| 6,537,855 B2 | * | 3/2003 | Taguchi et al. ............... | 438/118 |
| 6,547,946 B2 | * | 4/2003 | Meltzer et al. ............... | 205/181 |
| 8,022,390 B1 | * | 9/2011 | Kim et al. ....................... | 257/21 |

* cited by examiner

*Primary Examiner* — Evan Pert
(74) *Attorney, Agent, or Firm* — Westerman, Hattori, Daniels & Adrian, LLP (57) ABSTRACT

A semiconductor light receiving device includes: a first semiconductor light receiving element that is provided on a semiconductor substrate and has a mesa structure having an upper electrode to be coupled to an electrode wiring of a mounting carrier and a lower electrode; a first mesa that is provided on the semiconductor substrate and has an upper electrode coupled electrically to a lower electrode of the first semiconductor light receiving element with a wiring provided on the semiconductor substrate; and a second mesa that is provided on the semiconductor substrate and has an upper electrode that has a same electrical potential as the upper electrode of the first semiconductor light receiving element when coupled to the electrode wiring on the mounting carrier.

6 Claims, 11 Drawing Sheets

SEMICONDUCTOR LIGHT RECEIVING DEVICE

CROSS-REFERENCE TO RELATED APPLICATION

The present application is a continuation of and claims priority to Japanese Patent Application No. 2009-242175 filed on Oct. 21, 2009, subject matter of these patent documents is incorporated by reference herein in its entirety.

BACKGROUND (i) Technical Field

A certain aspect of the embodiments discussed herein is related to a semiconductor light receiving device.

(ii) Related Art

A semiconductor light receiving device may have a structure in which a flip-chip type semiconductor light receiving element having a mesa shape is provided on a semiconductor substrate. A mesa-shaped structure (a dummy mesa) not acting as a semiconductor light receiving element may be provided when a light receiving element is provided on a carrier in the semiconductor light receiving device.

The semiconductor light receiving device can be coupled to a wiring of a carrier when a wiring is provided from a lower electrode of the semiconductor light receiving element to an upper portion of the dummy mesa through a surface of the dummy mesa. However, when another wiring is provided from an upper electrode of the semiconductor light receiving element to be coupled to another electronic component to a bottom of the semiconductor light receiving element through a surface thereof, high electrical field may be applied between the wiring and the semiconductor light receiving element. This may result in a breaking of an insulating film covering the surface of the semiconductor light receiving element and an increase of a leak current. A parasitic capacity is generated between the wiring and the semiconductor light receiving element. The parasitic capacity may cause degradation of characteristics of the semiconductor light receiving element.

SUMMARY

According to an aspect of the present invention, there is provided a semiconductor light receiving device including: a first semiconductor light receiving element that is provided on a semiconductor substrate and has a mesa structure having an upper electrode to be coupled to an electrode wiring of a mounting carrier and a lower electrode; a first mesa that is provided on the semiconductor substrate and has an upper electrode coupled electrically to a lower electrode of the first semiconductor light receiving element with a wiring provided on the semiconductor substrate; and a second mesa that is provided on the semiconductor substrate and has an upper electrode that has a same electrical potential as the upper electrode of the first semiconductor light receiving element when coupled to the electrode wiring on the mounting carrier.

According to another aspect of the present invention, there is provided a semiconductor light receiving device including: a first semiconductor light receiving element that is provided on a semiconductor substrate and has a mesa structure having an upper electrode to be coupled to an electrode wiring of a mounting carrier and a lower electrode; a first mesa that is provided on the semiconductor substrate and has an upper electrode coupled electrically to a lower electrode of the first semiconductor light receiving element with a wiring provided on the semiconductor substrate; a second mesa that is provided on the semiconductor substrate and has an upper electrode that has a same electrical potential as the upper electrode of the first semiconductor light receiving element when coupled to the electrode wiring on the mounting carrier; a second semiconductor light receiving element that is provided on the semiconductor substrate and has a mesa structure having an upper electrode and a lower electrode to be coupled to the upper electrode of the second mesa with a wiring provided on the semiconductor substrate; a third semiconductor light receiving element that is provided on the semiconductor substrate and has an upper electrode to be coupled to a second electrode wiring of the mounting carrier and a lower electrode; a third mesa that is provided on the semiconductor substrate and has an upper electrode to be coupled electrically to the lower electrode of the third semiconductor light receiving element with a wiring provided on the semiconductor substrate; a fourth mesa that is provided on the semiconductor substrate and has an upper electrode that has a same potential as the upper electrode of the third semiconductor light receiving element when coupled to the second electrode wiring on the mounting carrier; and a fourth semiconductor light receiving element that is provided on the semiconductor substrate and has a mesa structure having an upper electrode and a lower electrode to be coupled to the upper electrode of the fourth mesa with a wiring provided on the semiconductor substrate.

According to another aspect of the present invention, there is provided a semiconductor light receiving device including: a light-receiving portion having a first semiconductor light receiving element, a first mesa and a second mesa, the first semiconductor light receiving element being provided on the semiconductor substrate and having a mesa structure having an upper electrode and a lower electrode, the first mesa being provided on the semiconductor substrate and having an upper electrode to be coupled to the lower electrode of the first semiconductor light receiving element with a wiring provided on the semiconductor substrate, the second mesa being provided on the semiconductor substrate and having an upper electrode; and a mounting carrier mounting the light-receiving portion and having an electrode wiring coupling the upper electrode of the first semiconductor light receiving element and the upper electrode of the second mesa in common.

DETAILED DESCRIPTION

A description will be given of a best mode for carrying the present invention.

(First Embodiment)

Figure 1A:
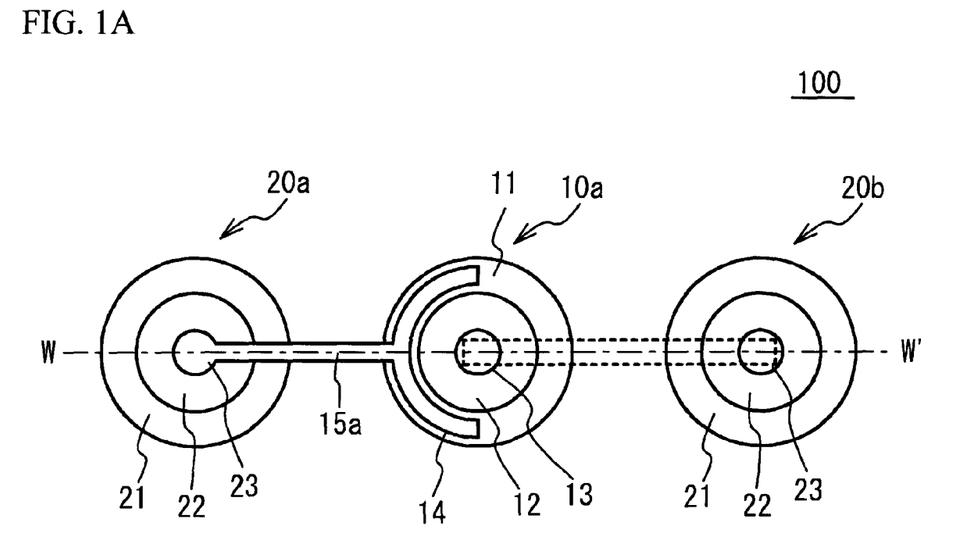
FIG. 1A illustrates a plane view of a mesa included in a semiconductor light receiving device in accordance with a first embodiment.

FIG. 1A illustrates a plane view of a mesa included in a semiconductor light receiving device 100 in accordance with a first embodiment. As illustrated in FIG. 1A, the semiconductor light receiving device 100 includes a semiconductor light receiving element 10a and dummy mesas 20a and 20b. The semiconductor light receiving element 10a and the dummy mesas 20a and 20b are mounted on a semi-insulating semiconductor substrate 50 described later. The semiconductor light receiving element 10a and the dummy mesas 20a and 20b have a mesa shape. The semiconductor light receiving device 100 includes a carrier 40 described later. In FIG. 1A, a carrier wiring of the carrier 40 is illustrated with a dotted line.

As illustrated in FIG. 1A, the semiconductor light receiving element 10a has a structure in which an upper mesa 12 and an upper electrode 13 are provided on a lower mesa 11 in this order. For example, the lower mesa 11 has a cylinder shape. The upper mesa 12 has a cylinder shape having a diameter smaller than that of the lower mesa 11 and is provided on a center area of the lower mesa 11. The upper mesa 12 acts as a light-receiving area. The upper electrode 13 has a cylinder shape having a diameter smaller than that of the upper mesa 12 and is provided on a center area of the upper mesa 12. That is, the semiconductor light receiving element 10a has a mesa shape having a larger diameter on the lower side and having a smaller diameter on the upper side. The semiconductor light receiving element 10a has a lower electrode 14 on an area other than the upper mesa 12 on the lower mesa 11.

The dummy mesas 20a and 20b have a structure in which an upper mesa 22 and an upper electrode 23 are provided on a lower mesa 21 in this order. For example, the lower mesa 21 has a cylinder shape. The upper mesa 22 has a cylinder shape having a diameter smaller than that of the lower mesa 21 and is provided on a center area of the lower mesa 21. The upper electrode 23 has a cylinder shape having a diameter smaller than that of the upper mesa 22 and is provided on a center area of the upper mesa 22. That is, the dummy mesas 20a and 20b have a mesa shape having a larger diameter on the lower side and having a smaller diameter on the upper side.

A wiring 15a passing a surface of the dummy mesa 20a couples the lower electrode 14 of the semiconductor light receiving element 10a and the upper electrode 23 of the dummy mesa 20a. On the other hand, the carrier wiring of the carrier 40 couples the upper electrode 13 of the semiconductor light receiving element 10a and the upper electrode 23 of the dummy mesa 20b. Therefore, there is no wiring passing through a surface of the semiconductor light receiving element 10a between the upper electrode 13 of the semiconductor light receiving element 10a and the upper electrode 23 of the dummy mesa 20b.

Figure 1B:
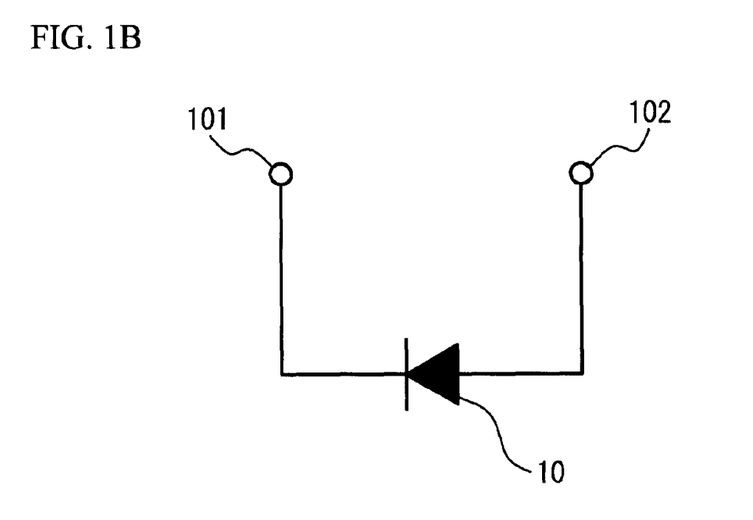
FIG. 1B illustrates an electric circuit diagram of the semiconductor light receiving element.

FIG. 1B illustrates an electric circuit diagram of the semiconductor light receiving device 100. As illustrated in FIG. 1B, the semiconductor light receiving device 100 includes an n-side terminal 101 and a p-side terminal 102. A wiring coupling the semiconductor light receiving element 10a and the n-side terminal 101 passes through the upper electrode 23 of the dummy mesa 20a illustrated in FIG. 1A. A wiring between the p-side terminal 102 and the semiconductor light receiving element 10a passes through the upper electrode 23 of the dummy mesa 20b illustrated in FIG. 1A.

Figure 2:
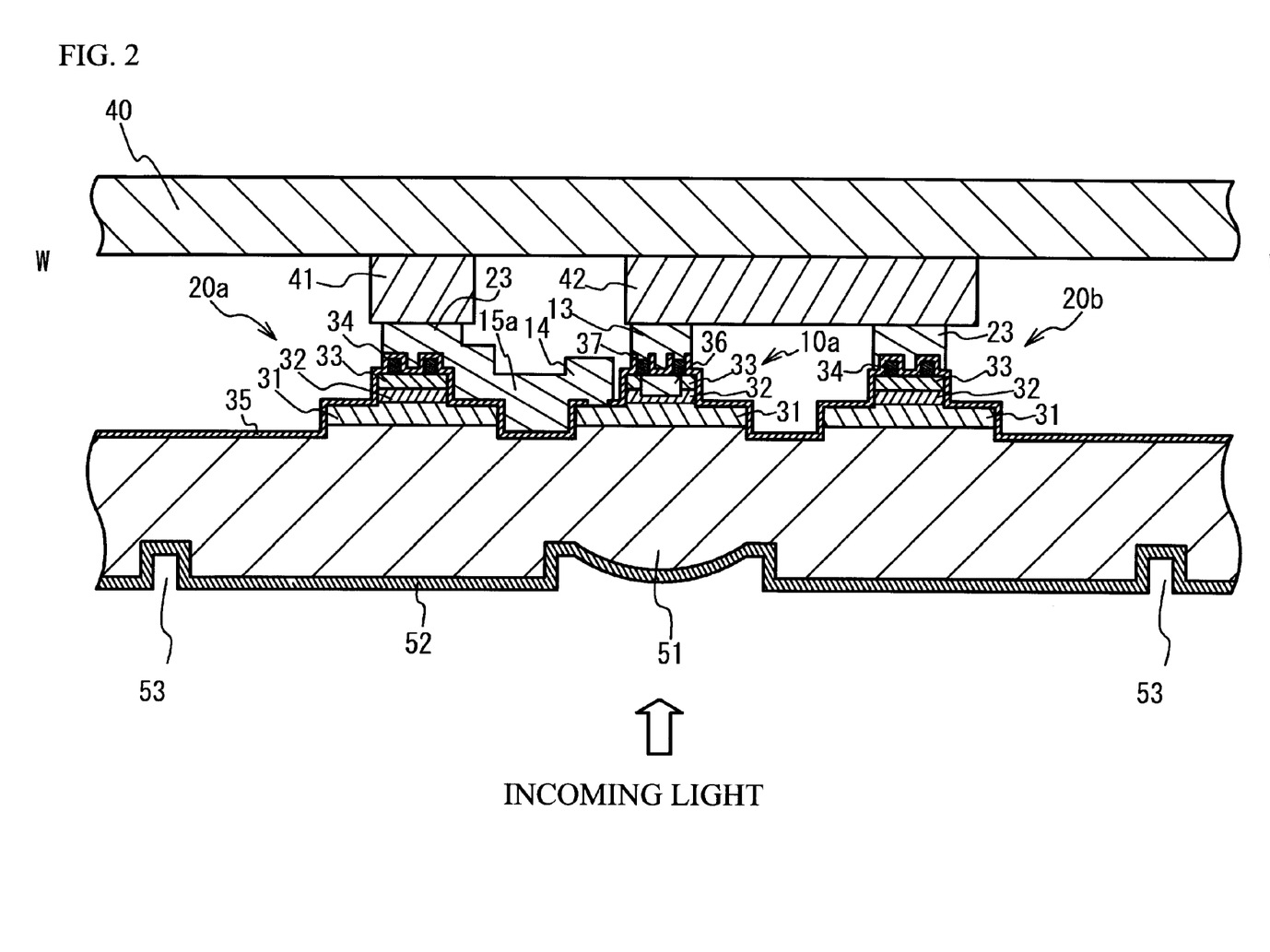
FIG. 2 illustrates a cross sectional view taken along a line W-W' of FIG. 1A.

FIG. 2 illustrates a cross sectional view taken along a line W-W' of FIG. 1A. FIG. 2 illustrates a cross sectional view of the carrier 40. In the embodiment, a reverse face of the semiconductor light receiving element 10a receives an incoming light. In FIG. 2, a lower side is a first main face side (a side of an incoming light) of the semi-insulating semiconductor substrate 50, and an upper side is a second main face side (a reverse side of the incoming light).

As illustrated in FIG. 2, the semiconductor light receiving element 10a and the dummy mesas 20a and 20b are provided on the semi-insulating semiconductor substrate 50. The semi-insulating semiconductor substrate 50 is, for example, made of InP or the like. A lens 51 is provided on an area of the first face of the semi-insulating semiconductor substrate 50 according to the semiconductor light receiving element 10a. In this case, the lens 51 is deeper than the face of the semiconductor substrate. Therefore, the lens 51 collects the light entering the first face of the semi-insulating semiconductor substrate 50 toward the semiconductor light receiving element 10a. An alignment mark 53 is formed around the lens 51 of the semi-insulating semiconductor substrate 50. The lens 51 and the alignment mark 53 can be formed in a single process. A low reflection film 52 made of SiN or the like is formed on the first face of the semi-insulating semiconductor substrate 50.

The semiconductor light receiving element 10a has a structure in which a contact layer 31, a light-absorption layer 32 and an n-window layer 33 are laminated in this order from the side of the semi-insulating semiconductor substrate 50. A p-window layer 36 is formed in the n-window layer 33. The p-window layer 36 is made of a p-type semiconductor such as p-InP. The p-window layer 36 can be formed by diffusing a p-type dopant into the n-window layer 33. A contact layer 37 is provided on the p-window layer 36. The contact layer 37 is made of p-type semiconductor such as p-InGaAs.

An insulating layer 35 covers the contact layer 31, the light absorption layer 32 and the p-window layer 36. The upper electrode 13 acting as a bump electrode is provided on the contact layer 37. A part of the insulating layer 35 contacting an upper part of the contact layer 37 is eliminated. The upper electrode 13 is electrically coupled to the contact layer 37. The lower electrode 14 is provided on an exposed area of the contact layer 31. The wiring 15a couples the lower electrode 14 and the upper electrode 23 of the dummy mesa 20a.

The dummy mesas 20a and 20b have a structure in which the contact layer 31, the light-absorption layer 32 and the n-window layer 33 are laminated in this order from the side of the semi-insulating semiconductor substrate 50. The contact layer 31 is made of n-type semiconductor such as n-InP. The light-absorption layer 32 is made of i-type semiconductor such as i-InGaAs. The n-window layer 33 is made of n-type semiconductor such as n-InP. A contact layer 34 is provided on the n-window layer 33. The contact layer 34 is made of n-type semiconductor such as n-InGaAs. The insulating layer 35 covers the contact layer 31, the light absorption layer 32, the n-window layer 33 and the contact layer 34. The upper electrode 23 is provided above the n-window layer 33 and the contact layer 34. The insulating layer 35 is provided between the upper electrode 23 and the n-window layer 33 or the contact layer 34. The upper electrode 23 acts as a bump electrode, and is not electrically coupled to the n-window layer 33 or the contact layer 34.

In a correspondence relationship of the dummy mesas 20a and 20b between FIG. 1A and FIG. 2, the contact layer 31 and the insulating layer 35 correspond to the lower mesa 21. The light-absorption layer 32, the n-window layer 33 and the insulating layer 35 correspond to the upper mesa 22.

The carrier 40 is provided in an opposite side of the semi-insulating semiconductor substrate 50 with respect to the semiconductor light receiving element 10a. Carrier wirings 41 and 42 are provided on a face of the carrier 40 on the side of the semiconductor light receiving element 10a. The carrier wirings 41 and 42 are a pattern wiring formed on the carrier 40. The carrier wiring 41 is coupled to the upper electrode 23 of the dummy mesa 20a. The carrier wiring 42 couples the upper electrode 13 of the semiconductor light receiving element 10a and the upper electrode 23 of the dummy mesa 20b.

In a correspondence relationship of the semiconductor light receiving element 10a between FIG. 1A and FIG. 2, the contact layer 31 and the insulating layer 35 correspond to the lower mesa 11. And, the light-absorption layer 32, the p-window layer 36, the n-window layer 33 and the insulating layer 35 correspond to the upper mesa 12.

There is no wiring passing through the surface of the semiconductor light receiving element 10a, between the upper electrode 13 of the semiconductor light receiving element 10a and the upper electrode 23 of the dummy mesa 20b, because the carrier wiring 42 couples the upper electrode 13 of the semiconductor light receiving element 10a and the upper electrode 23 of the dummy mesa 20b as illustrated in FIG. 2. With the structure, applying of high electrical field to the insulating layer 35 provided on the surface of the semiconductor light receiving element 10a is restrained. Therefore, a leakage current and a parasitic capacity at the insulating layer 35 are restrained.

The wiring 15a passes through on the insulating layer 35 and extends to the upper electrode 23 of the dummy mesa 20a. That is, the wiring 15a is provided on the surface of the insulating layer 35 provided on the surface of the semiconductor light receiving element 10a, the surface of the semi-insulating semiconductor substrate 50 and the surface of the dummy mesa 20a. The wiring 15a is coupled to the upper electrode 23. However, the contact layer 31 is not coupled to an outside component, although the wiring 15a extends from the lower electrode of the semiconductor light receiving element 10a and is coupled to the carrier wiring 41. Therefore, applying of high electrical field to the insulating layer 35 provided on the surface of the contact layer 31 of the semiconductor light receiving element 10a is restrained.

In the embodiment, the semiconductor light receiving element 10a acts as a first semiconductor light receiving element, the dummy mesa 20a acts as a first mesa, and the dummy mesa 20b acts as a second mesa.

(Modified Embodiment)

Figure 3:
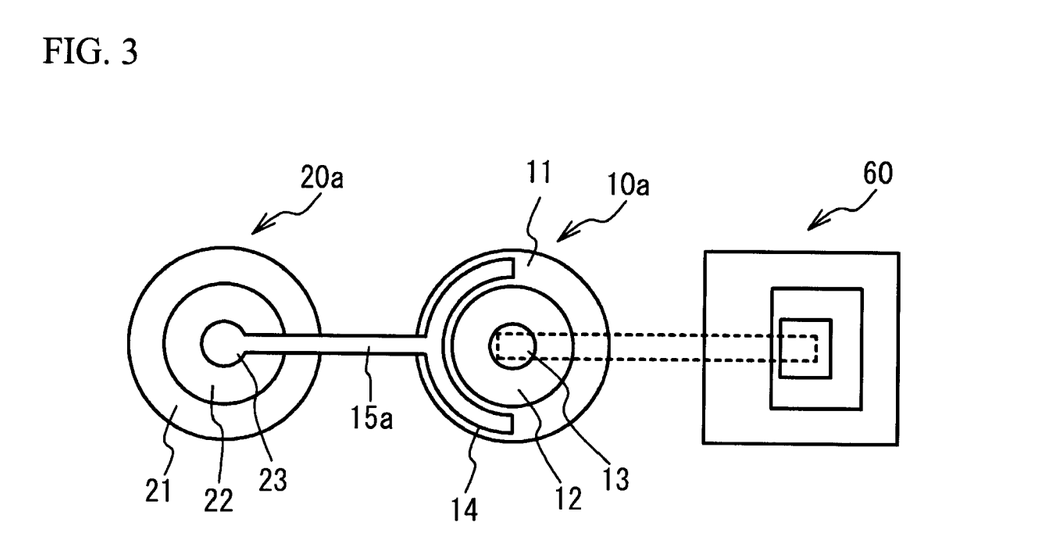
FIG. 3 illustrates a modified embodiment of the first embodiment.

FIG. 3 illustrates a modified embodiment of the first embodiment. As illustrated in FIG. 3, there may be provided a mesa-shaped device 60 including a passive element such as a capacitor and a resistor instead of the dummy mesa 20b. In this case, applying high electrical field to the insulating layer 35 provided on the surface of the semiconductor light receiving element 10a is restrained if a carrier wiring coupling the upper electrode 13 of the semiconductor light receiving element 10a and an upper electrode of another device 60. In the modified embodiment, the mesa-shaped device 60 acts as the second mesa.

(Second Embodiment)

Figure 4A:
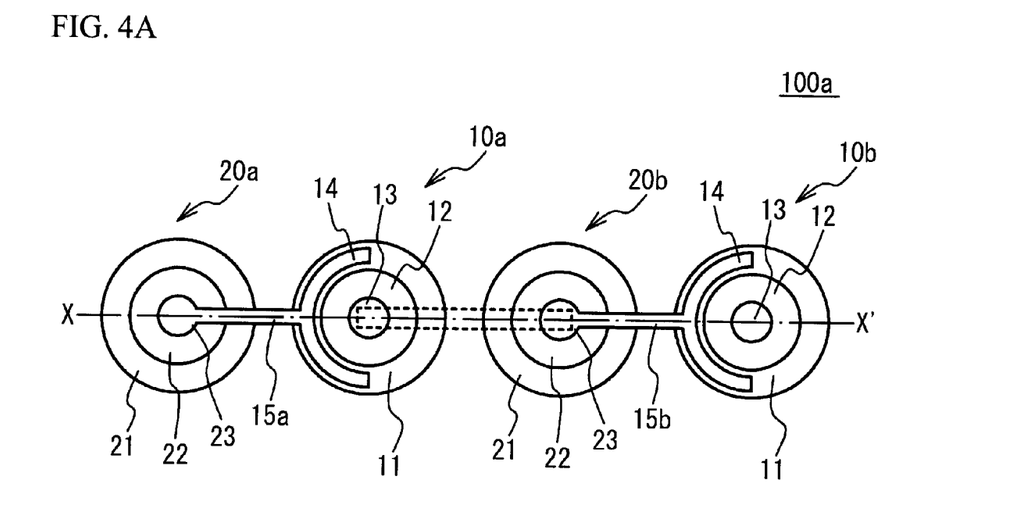
FIG. 4A illustrates a plane view of a mesa included in a semiconductor light receiving device in accordance with a second embodiment.

A second embodiment is a case where two semiconductor light receiving elements are provided on the semi-insulating semiconductor substrate 50. FIG. 4A illustrates a plane view of a mesa included in a semiconductor light receiving device 100a in accordance with the second embodiment. As illustrated in FIG. 4A, the semiconductor light receiving device 100a includes the semiconductor light receiving elements 10a and 10b and the dummy mesas 20a and 20b. The semiconductor light receiving elements 10a and 10b and the dummy mesas 20a and 20b are formed on the semi-insulating semiconductor substrate 50 and have a mesa shape. The semiconductor light receiving element 10b has the same structure as the semiconductor light receiving element 10a. In FIG. 4A, a carrier wiring of the carrier 40 are illustrated with a dotted line.

As illustrated in FIG. 4A, the dummy mesa 20a, the semiconductor light receiving element 10a, the dummy mesa 20b and the semiconductor light receiving element 10b are aligned in this order. The wiring 15a couples the lower electrode 14 of the semiconductor light receiving element 10a and the upper electrode 23 of the dummy mesa 20a. A wiring 15b couples the lower electrode 14 of the semiconductor light receiving element 10b and the upper electrode 23 of the dummy mesa 20b. The wiring 15b is made of the same material as the wiring 15a. On the other hand, the carrier wiring of the carrier 40 couples the upper electrode 13 of the semiconductor light receiving element 10a and the upper electrode 23 of the dummy mesa 20b.

Figure 4B:
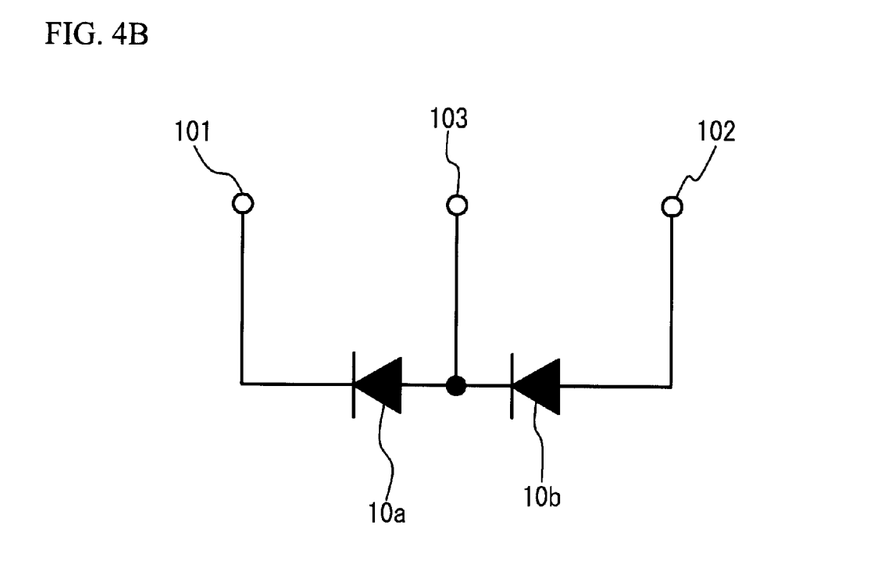
FIG. 4B illustrates an electric circuit diagram of the semiconductor light receiving device.

FIG. 4B illustrates an electrical circuit diagram of the semiconductor light receiving device 100a. As illustrated in FIG. 4B, the semiconductor light receiving elements 10a and 10b are coupled in series. A wiring coupling the semiconductor light receiving element 10a and the n-side terminal 101 passes through the upper electrode 23 of the dummy mesa 20a illustrated in FIG. 4A. A wiring coupling the p-side terminal 102 and the semiconductor light receiving element 10b passes through the upper electrode 13 of the semiconductor light receiving element 10b illustrated in FIG. 4A. A wiring coupling an intermediate terminal 103 and the semiconductor light receiving elements 10a and 10b passes through the carrier wiring of the carrier 40.

Figure 5:
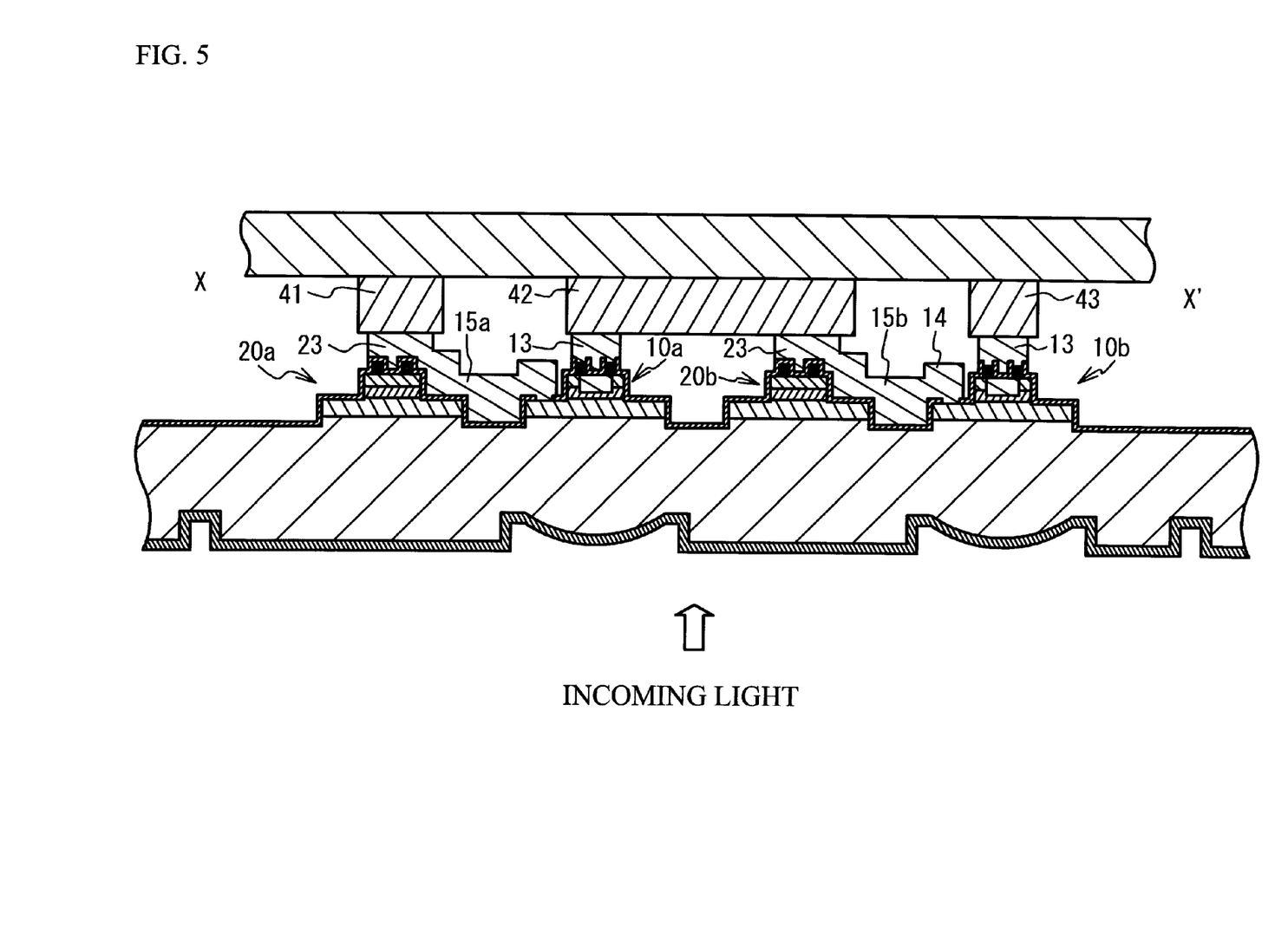
FIG. 5 illustrates a cross sectional view taken along a line X-X' of FIG. 4A.

FIG. 5 illustrates a cross sectional view taken along a line X-X' of FIG. 4A. FIG. 5 illustrates a cross sectional view of the carrier 40. The dummy mesa 20a, the semiconductor light receiving element 10a and the dummy mesa 20b in FIG. 5 have the same structure of FIG. 2. FIG. 5 is different from FIG. 2 in a point that the wiring 15b extends from the lower electrode 14 of the semiconductor light receiving element 10a to the upper electrode 23 of the dummy mesa 20b and in a point that the semiconductor light receiving element 10b is provided. The semiconductor light receiving element 10b has the same structure as the semiconductor light receiving element 10a.

In the embodiment, there is no wiring passing through the surface of the semiconductor light receiving element 10a, between the upper electrode 13 of the semiconductor light receiving element 10a and the upper electrode 13 of the semiconductor light receiving element 10b, because the carrier wiring 42 couples the upper electrode 13 of the semiconductor light receiving element 10a and the upper electrode 23 of the dummy mesa 20b. With the structure, applying high electrical field to the insulating layer 35 provided on the surface of the semiconductor light receiving element 10*a* is restrained. Therefore, a leakage current and a parasitic capacity at the insulating layer 35 are restrained. In the embodiment, the semiconductor light receiving element 10*b* acts as a second semiconductor light receiving element.

(Third Embodiment)

Figure 6A:
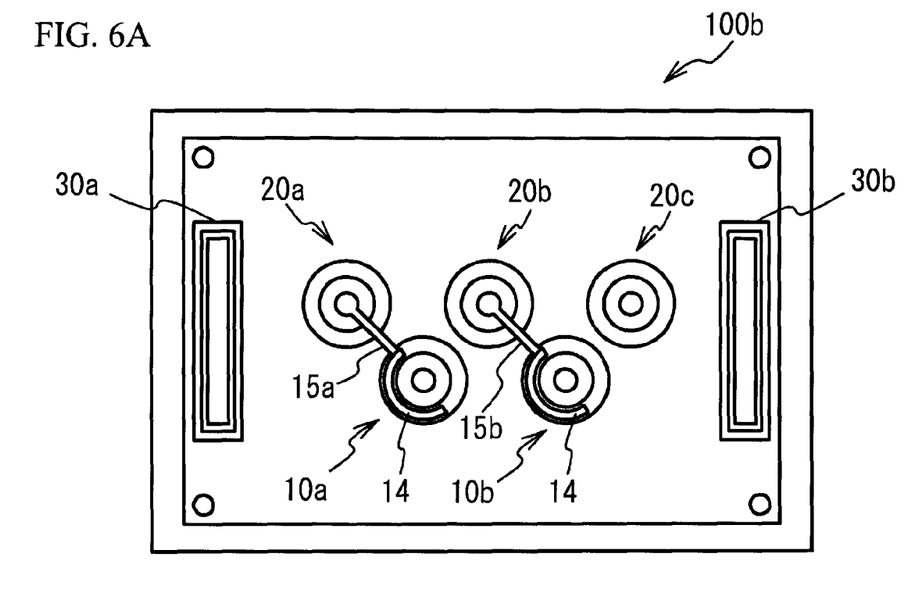
FIG. 6A illustrates a plane view of a mesa included in a semiconductor light receiving device in accordance with a third embodiment.

A third embodiment is a case where a dummy mesa 20*c* is provided in an opposite side of the dummy mesa 20*b* with respect to the semiconductor light receiving element 10*b*. FIG. 6A illustrates a plane view of a mesa included in a semiconductor light receiving device 100*b* in accordance with the third embodiment. As illustrated in FIG. 6A, the semiconductor light receiving device 100*b* includes the semiconductor light receiving elements 10*a* and 10*b* and the dummy mesas 20*a* to 20*c*. The semiconductor light receiving elements 10*a* and 10*b* and the dummy mesas 20*a* to 20*c* are provided on the semi-insulating semiconductor substrate 50 and have a mesa shape. The dummy mesa 20*c* has the same structure as the dummy mesas 20*a* and 20*b*.

A dummy mesa 30*a* and a dummy mesa 30*b* are formed on the semi-insulating semiconductor substrate 50. The dummy mesas 30*a* and 30*b* have the same height as the dummy mesas 20*a* to 20*c* and secure the strength of the semiconductor light receiving device 100*b*.

The semiconductor light receiving element 10*a* and the semiconductor light receiving element 10*b* are arrayed on a first line in this order. The dummy mesa 20*a*, the dummy mesa 20*b* and the dummy mesa 20*c* are arrayed on a second line in this order. The semiconductor light receiving element 10*a* is adjacent to the dummy mesas 20*a* and 20*b*. The semiconductor light receiving element 10*b* is adjacent to the dummy mesas 20*b* and 20*c*. Thus, the semiconductor light receiving elements 10*a* and 10*b* and the dummy mesas 20*a* to 20*c* are arrayed in a zigzag alignment. In the embodiment, five mesas are arrayed in a zigzag alignment. Therefore, the placement points of the semiconductor light receiving elements 10*a* and 10*b* and the dummy mesas 20*a* to 20*c* form a shape of an alphabet "W".

In other words, the semiconductor light receiving elements 10*a* and 10*b* are arrayed on the first line in this order, and the dummy mesas 20*a* to 20*c* are arrayed on the second line in this order. This alignment allows an adjacency of the semiconductor light receiving elements 10*a* and 10*b*. In this case, the semiconductor light receiving elements 10*a* and 10*b* are substantially capable of receiving the same light. A fluctuation of sensitivity characteristic of the semiconductor light receiving elements 10*a* and 10*b* is restrained.

Figure 6B:
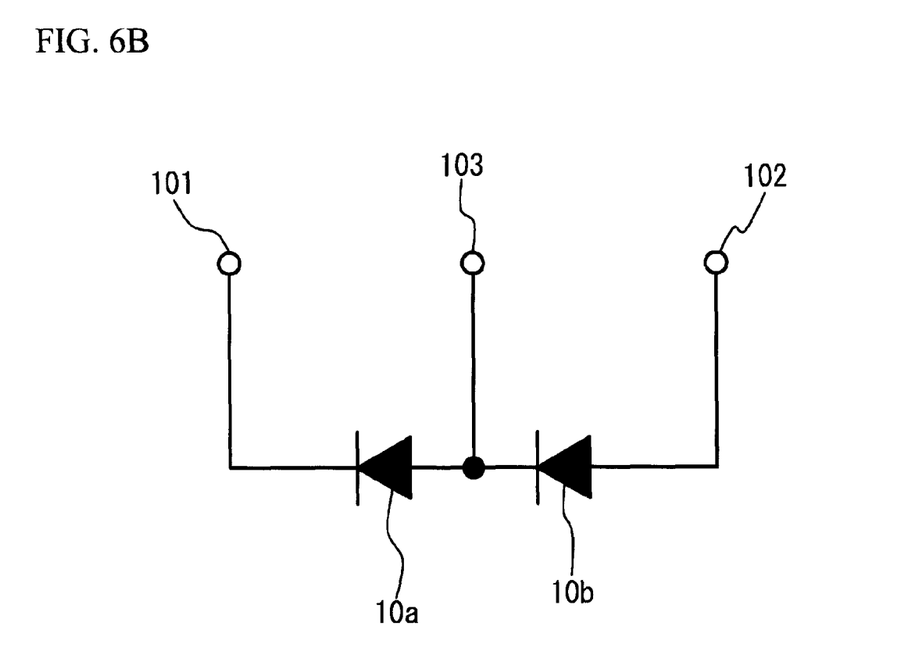
FIG. 6B illustrates an electric circuit diagram of the semiconductor light receiving device.

FIG. 6B illustrates an electric circuit diagram of the semiconductor light receiving device 100*b*. As illustrated in FIG. 6B, the semiconductor light receiving elements 10*a* and 10*b* are coupled in series. A wiring coupling the semiconductor light receiving element 10*a* and the n-side terminal 101 passes through the upper electrode 23 of the dummy mesa 20*a* illustrated in FIG. 6A. A wiring coupling the p-side terminal 102 and the semiconductor light receiving element 10*b* passes through the upper electrode 23 of the dummy mesa 20*c* illustrated in FIG. 6A. A wiring coupling the intermediate terminal 103 and the semiconductor light receiving elements 10*a* and 10*b* passes through the upper electrode 23 of the dummy mesa 20*b*.

Figure 7:
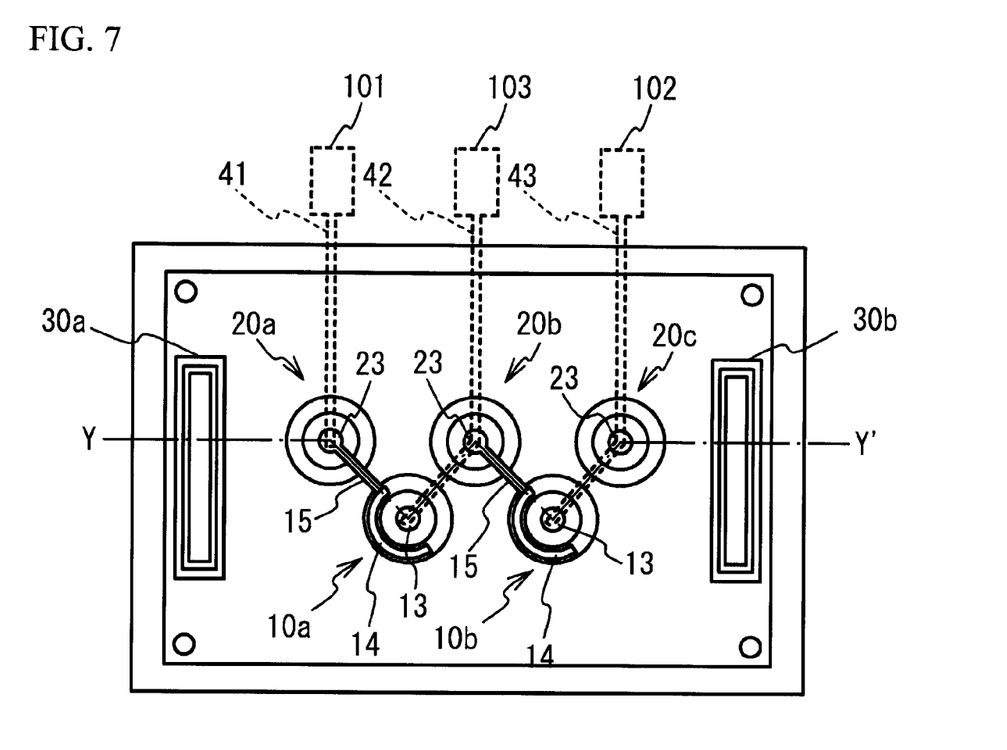
FIG. 7 illustrates a carrier wiring of a carrier with a dotted line.

FIG. 7 illustrates the carrier wirings 41, 42 and 43 of the carrier 40 with a dotted line. As illustrated in FIG. 7, the carrier wiring 41 extends from the upper electrode 23 of the dummy mesa 20*a* to the n-side terminal 101. The carrier wiring 42 extends from the upper electrode 13 of the semiconductor light receiving element 10*a* to the intermediate terminal 103 through the upper electrode 23 of the dummy mesa 20*b*. The carrier wiring 43 extends from the upper electrode 13 of the semiconductor light receiving element 10*b* to the p-side terminal 102 through the upper electrode 23 of the dummy mesa 20*c*.

Figure 8:
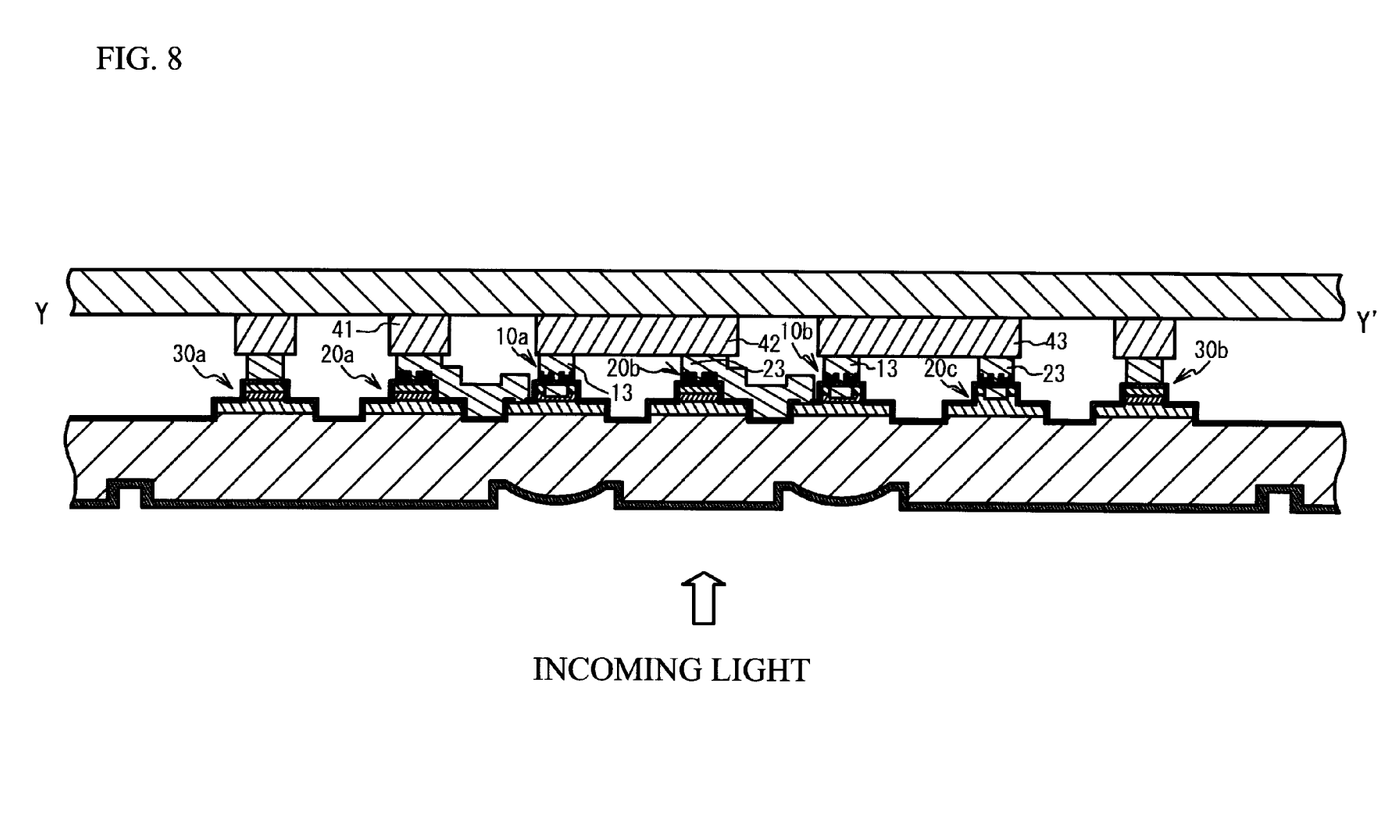
FIG. 8 illustrates a cross sectional view taken along a line Y-Y' of FIG. 6A.

FIG. 8 illustrates a cross sectional view taken along a line Y-Y' of FIG. 6A. In FIG. 8, a cross sectional view of the carrier 40 is also illustrated. The dummy mesas 20*a* and 20*b* and the semiconductor light receiving elements 10*a* and 10*b* in FIG. 8 have the same structure as FIG. 5. The dummy mesas 30*a* and 30*b* have the same structure as the dummy mesas 20*a* to 20*c* other than not having the contact layer 34.

There is no wiring passing through the surface of the semiconductor light receiving element 10*a*, between the upper electrode 13 of the semiconductor light receiving element 10*a* and the upper electrode 23 of the dummy mesa 20*b*, because the carrier wiring 42 couples the upper electrode 13 of the semiconductor light receiving element 10*a* and the upper electrode 23 of the dummy mesa 20*b*. There is no wiring passing through the surface of the semiconductor light receiving element 10*b*, between the upper electrode 13 of the semiconductor light receiving element 10*b* and the upper electrode 23 of the dummy mesa 20*c*, because the carrier wiring 43 couples the upper electrode 13 of the semiconductor light receiving element 10*b* and the upper electrode 23 of the dummy mesa 20*c*. With the structure, applying of high electrical field to the insulating layer 35 provided on the surface of the semiconductor light receiving element 10*a* and the semiconductor light receiving element 10*b* is restrained. Therefore, a leakage current and a parasitic capacity at the insulating layer 35 are restrained. In the embodiment, the dummy mesa 20*c* acts as a third mesa.

(Fourth Embodiment)

Figure 9A:
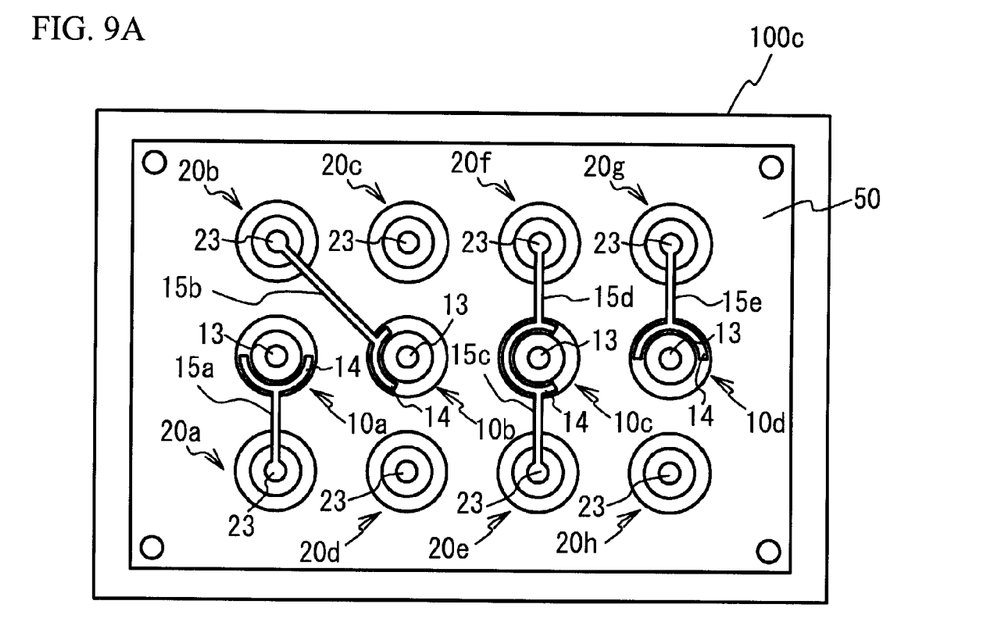
FIG. 9A illustrates a plane view of a mesa included in a semiconductor light receiving device in accordance with a fourth embodiment.

A fourth embodiment is another case where two semiconductor light receiving elements are coupled in series. FIG. 9A illustrates a plane view of a mesa included in a semiconductor light receiving device 100*c* in accordance with the fourth embodiment. As illustrated in FIG. 9A, the semiconductor light receiving device 100*c* includes semiconductor light receiving elements 10*a* to 10*d* and dummy mesas 20*a* to 20*h*. The semiconductor light receiving elements 10*a* to 10*d* and the dummy mesas 20*a* to 20*h* have a mesa shape. The semiconductor light receiving elements 10*c* and 10*d* have the same structure as the semiconductor light receiving elements 10*a* and 10*b*. The dummy mesas 20*d* to 20*h* have the same structure as the dummy mesas 20*a* to 20*c*.

Figure 9B:
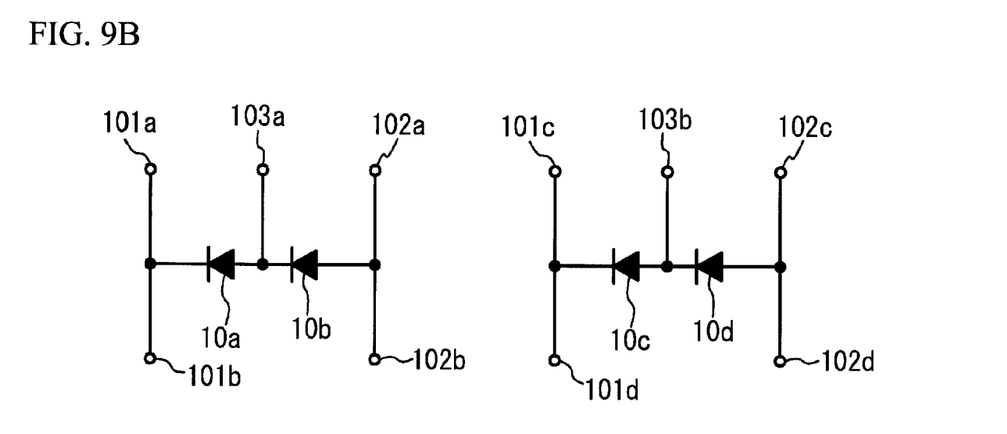
FIG. 9B illustrates an electric circuit diagram of the semiconductor light receiving device.

FIG. 9B illustrates an electric circuit diagram of the semiconductor light receiving device 100*c*. As illustrated in FIG. 9B, the semiconductor light receiving element 10*a* and the semiconductor light receiving element 10*b* are coupled in series. An n-side terminal 101*a* and an n-side terminal 101*b* are coupled to an n-side of the semiconductor light receiving element 10*a*. A p-side terminal 102*a* and a p-side terminal 102*b* are coupled to a p-side of the semiconductor light receiving element 10*b*. An intermediate terminal 103*a* is coupled to between the semiconductor light receiving element 10*a* and the semiconductor light receiving element 10*b*.

The semiconductor light receiving element 10*c* and the semiconductor light receiving element 10*d* are coupled in series. An n-side terminal 101*c* and an n-side terminal 101*d* are coupled to an n-side of the semiconductor light receiving element 10*c*. A p-side terminal 102*c* and a p-side terminal 102*d* are coupled to a p-side of the semiconductor light receiving element 10*d*. An intermediate terminal 103*b* is coupled to between the semiconductor light receiving element 10*c* and the semiconductor light receiving element 10*d*.

The dummy mesa 20*a*, the semiconductor light receiving element 10*a* and the dummy mesa 20*b* are arrayed on a first line in this order. The dummy mesa 20d, the semiconductor light receiving element 10b and the dummy mesa 20c are arrayed on a second line in this order. The dummy mesa 20e, the semiconductor light receiving element 10c and the dummy mesa 20f are arrayed on a third line in this order. The dummy mesa 20h, the semiconductor light receiving element 10d and the dummy mesa 20g are arrayed on a fourth line in this order. The semiconductor light receiving element 10a and the semiconductor light receiving element 10b are adjacent to each other. The dummy mesas 20b, 20c, 20f and 20g are arrayed on a first column in this order. The semiconductor light receiving elements 10a, 10b, 10c and 10d are arrayed on a second column in this order. The dummy mesas 20a, 20d, 20e and 20h are arrayed on a third column in this order. Therefore, the semiconductor light receiving elements 10a and 10b are substantially capable of receiving the same light. A fluctuation of sensitivity characteristic of the semiconductor light receiving elements 10a and 10b is restrained. The semiconductor light receiving element 10c and the semiconductor light receiving element 10d are substantially capable of receiving the same light because the semiconductor light receiving element 10c is adjacent to the semiconductor light receiving element 10d. Therefore, a fluctuation of sensitivity characteristic of the semiconductor light receiving elements 10c and 10d is restrained.

The wiring 15a is provided from the lower electrode 14 of the semiconductor light receiving element 10a to the upper electrode 23 of the dummy mesa 20a. The wiring 15b is provided from the lower electrode 14 of the semiconductor light receiving element 10b to the upper electrode 23 of the dummy mesa 20b. A wiring 15c is provided from the lower electrode 14 of the semiconductor light receiving element 10c to the upper electrode 23 of the dummy mesa 20e. A wiring 15d is provided from the lower electrode 14 of the semiconductor light receiving element 10c to the upper electrode 23 of the dummy mesa 20f. A wiring 15e is provided from the lower electrode 14 of the semiconductor light receiving element 10d to the upper electrode 23 of the dummy mesa 20g.

Figure 10:
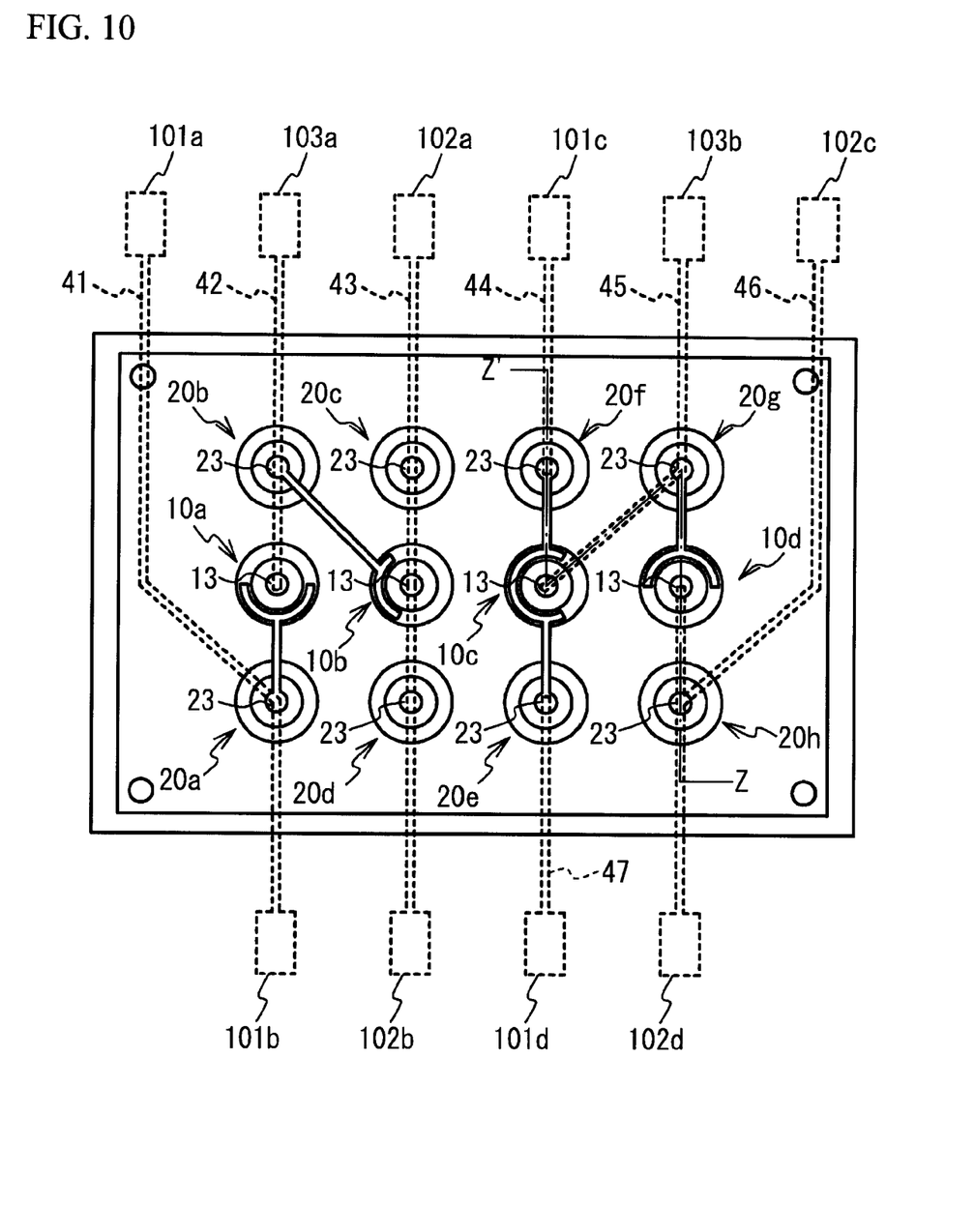
FIG. 10 illustrates a plane view of a carrier wiring of a carrier with a dotted line.

FIG. 10 illustrates a plane view of carrier wirings 41 to 47 of the carrier 40 with a dotted line. As illustrated in FIG. 10, the carrier wiring 41 extends from the upper electrode 23 of the dummy mesa 20a to the n-side terminal 101a and to the n-side terminal 101b. The carrier wiring 42 extends from the upper electrode 13 of the semiconductor light receiving element 10a to the intermediate terminal 103a through the upper electrode 23 of the dummy mesa 20b. The carrier wiring 43 extends from the upper electrode 13 of the semiconductor light receiving element 10b to the p-side terminal 102a through the upper electrode 23 of the dummy mesa 20c and to the p-side terminal 102b through the upper electrode 23 of the dummy mesa 20d.

The carrier wiring 44 extends from the upper electrode 23 of the dummy mesa 20f to the n-side terminal 101c. The carrier wiring 45 extends from the upper electrode 13 of the semiconductor light receiving element 10c to the intermediate terminal 103b through the upper electrode 23 of the dummy mesa 20g. The carrier wiring 46 extends from the upper electrode 13 of the semiconductor light receiving element 10d to the p-side terminal 102c through the upper electrode 23 of the dummy mesa 20h and to the p-side terminal 102d. The carrier wiring 47 extends from the upper electrode 23 of the dummy mesa 20e to the n-side terminal 101d.

The n-side terminals 101a and 101c, the p-side terminals 102a and 102c and the intermediate terminals 103a and 103b are arranged on the side of the dummy mesas 20b, 20c, 20f and 20g with respect to the semiconductor light receiving device 100c. These terminals are used for collecting an electrical signal from the semiconductor light receiving device 100c. On the other hand, the n-side terminals 101b and 101d and the p-side terminals 102b and 102d are arranged on the side of the dummy mesas 20a, 20d, 20e and 20h with respect to the semiconductor light receiving device 100c. These terminals are used as a terminal for monitoring the semiconductor light receiving device 100c.

Figure 11:
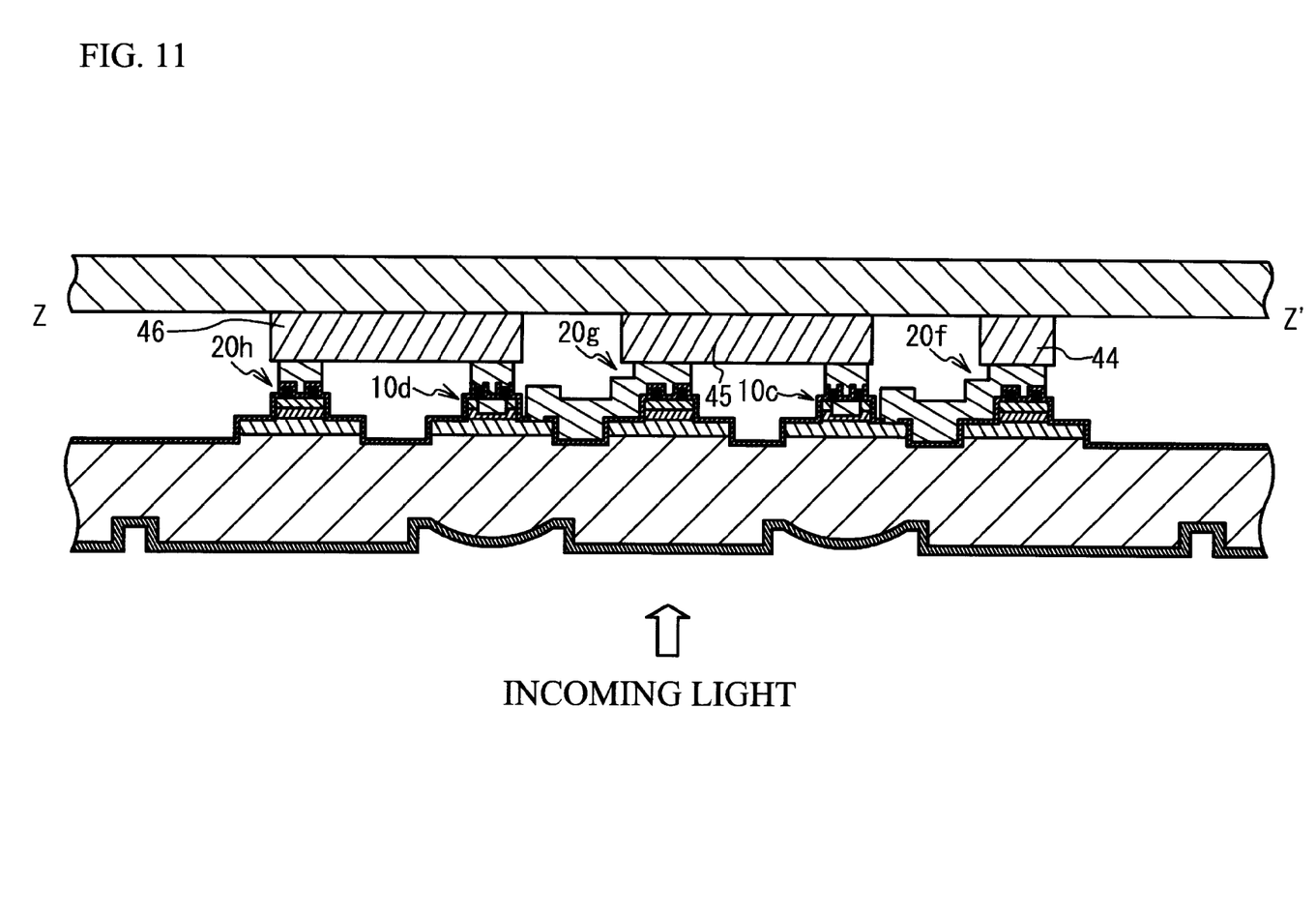
FIG. 11 illustrates a cross sectional view taken along a line Z-Z' of FIG. 10.

FIG. 11 illustrates a cross sectional view taken along a line Z-Z' of FIG. 10. In FIG. 11, a cross sectional view of the carrier 40 is also illustrated. The dummy mesas 20f, 20g and 20h and the semiconductor light receiving elements 10c and 10d have the same structure as the dummy mesas 20a to 20c and the semiconductor light receiving elements 10a and 10b.

In the embodiment, there is no wiring passing through the surface of the semiconductor light receiving element, between the upper electrode of the semiconductor light receiving element and the upper electrode of the dummy mesa, because the carrier wiring couples the upper electrode of the semiconductor light receiving element and the upper electrode of the dummy mesa. With the structure, applying of high electrical field to the insulating layer 35 provided on the surface of the semiconductor light receiving element is restrained. Therefore, a leakage current and a parasitic capacity at the insulating layer 35 are restrained.

In the embodiment, the semiconductor light receiving element 10a acts as a first semiconductor light receiving element, the dummy mesa 20a acts as a first mesa, the dummy mesa 20b acts as a second mesa, the semiconductor light receiving element 10b acts as a second semiconductor light receiving element, the semiconductor light receiving element 10c acts as a third semiconductor light receiving element, the dummy mesa 20f acts as a third mesa, the dummy mesa 20g acts as a fourth mesa, and the semiconductor light receiving element 10d acts as a fourth semiconductor light receiving element.

The present invention is not limited to the specifically described embodiments and variations but other embodiments and variations may be made without departing from the scope of the claimed invention.

What is claimed is:

1. A semiconductor light receiving device comprising:
   a first semiconductor light receiving element that is provided on a semiconductor substrate and has a mesa structure having an upper electrode to be coupled to an electrode wiring of a mounting carrier and a lower electrode;
   a first mesa that is provided on the semiconductor substrate and has an upper electrode coupled electrically to a lower electrode of the first semiconductor light receiving element with a wiring provided on the semiconductor substrate; and
   a second mesa that is provided on the semiconductor substrate and has an upper electrode that has a same electrical potential as the upper electrode of the first semiconductor light receiving element when coupled to the electrode wiring on the mounting carrier.

2. The semiconductor light receiving device as claimed in claim 1, wherein the upper electrode of the second mesa is to be coupled to an element other than the first semiconductor light receiving element with a wiring provided on the semiconductor substrate.

3. The semiconductor light receiving device as claimed in claim 1 further comprising a second semiconductor light receiving element that is provided on the semiconductor substrate and has a mesa structure having an upper electrode and a lower electrode, wherein the upper electrode of the second mesa is coupled to the lower electrode of the second semiconductor light receiving element with a wiring provided on the semiconductor substrate.

4. The semiconductor light receiving device as claimed in claim 3 further comprising a third mesa provided on the semiconductor substrate and having an upper electrode,
wherein the first mesa, the first semiconductor light receiving element, the second mesa, the second semiconductor light receiving element and the third mesa are arrayed in this order in a zigzag alignment.

5. A semiconductor light receiving device comprising:
a first semiconductor light receiving element that is provided on a semiconductor substrate and has a mesa structure having an upper electrode to be coupled to an electrode wiring of a mounting carrier and a lower electrode;
a first mesa that is provided on the semiconductor substrate and has an upper electrode coupled electrically to a lower electrode of the first semiconductor light receiving element with a wiring provided on the semiconductor substrate;
a second mesa that is provided on the semiconductor substrate and has an upper electrode that has a same electrical potential as the upper electrode of the first semiconductor light receiving element when coupled to the electrode wiring on the mounting carrier;
a second semiconductor light receiving element that is provided on the semiconductor substrate and has a mesa structure having an upper electrode and a lower electrode to be coupled to the upper electrode of the second mesa with a wiring provided on the semiconductor substrate;
a third semiconductor light receiving element that is provided on the semiconductor substrate and has an upper electrode to be coupled to a second electrode wiring of the mounting carrier and a lower electrode;
a third mesa that is provided on the semiconductor substrate and has an upper electrode to be coupled electrically to the lower electrode of the third semiconductor light receiving element with a wiring provided on the semiconductor substrate;
a fourth mesa that is provided on the semiconductor substrate and has an upper electrode that has a same potential as the upper electrode of the third semiconductor light receiving element when coupled to the second electrode wiring on the mounting carrier; and
a fourth semiconductor light receiving element that is provided on the semiconductor substrate and has a mesa structure having an upper electrode and a lower electrode to be coupled to the upper electrode of the fourth mesa with a wiring provided on the semiconductor substrate.

6. A semiconductor light receiving device comprising:
a light-receiving portion having a first semiconductor light receiving element, a first mesa and a second mesa, the first semiconductor light receiving element being provided on the semiconductor substrate and having a mesa structure having an upper electrode and a lower electrode, the first mesa being provided on the semiconductor substrate and having an upper electrode to be coupled to the lower electrode of the first semiconductor light receiving element with a wiring provided on the semiconductor substrate, the second mesa being provided on the semiconductor substrate and having an upper electrode; and
a mounting carrier mounting the light-receiving portion and having an electrode wiring coupling the upper electrode of the first semiconductor light receiving element and the upper electrode of the second mesa in common.

* * * * *